(12) United States Patent
Briggs et al.

(10) Patent No.: US 12,019,407 B2
(45) Date of Patent: Jun. 25, 2024

(54) OSCILLATION DEVICE

(71) Applicant: Oxford University Innovation Limited, Oxford (GB)

(72) Inventors: Andrew Briggs, Oxford (GB); Edward Laird, Oxford (GB); Kyriakos Porfyrakis, Oxford (GB)

(73) Assignee: OXFORD UNIVERSITY INNOVATION LIMITED, Oxford (GB)

( * ) Notice: Subject to any disclaimer, the term of this patent is extended or adjusted under 35 U.S.C. 154(b) by 30 days.

(21) Appl. No.: 17/911,264

(22) PCT Filed: Mar. 16, 2021

(86) PCT No.: PCT/GB2021/050648
§ 371 (c)(1),
(2) Date: Sep. 13, 2022

(87) PCT Pub. No.: WO2021/186161
PCT Pub. Date: Sep. 23, 2021

(65) Prior Publication Data
US 2023/0095704 A1    Mar. 30, 2023

(30) Foreign Application Priority Data

Mar. 16, 2020 (GR) .............................. 20200100135
Mar. 23, 2020 (GB) ..................................... 2004175

(51) Int. Cl.
G04F 5/14      (2006.01)
H03L 1/00      (2006.01)
H03L 7/26      (2006.01)

(52) U.S. Cl.
CPC .................. *G04F 5/14* (2013.01); *H03L 1/00* (2013.01); *H03L 7/26* (2013.01)

(58) Field of Classification Search
CPC ............... G04F 5/14; G04F 5/145; H03L 7/26
See application file for complete search history.

(56) References Cited

U.S. PATENT DOCUMENTS

2010/0259334 A1    10/2010 Briggs et al.
2012/0235753 A1    9/2012 Nishida
(Continued)

OTHER PUBLICATIONS

International Search Report and Written Opinion for WO 2021/186161 (PCT/GB2021/050648), dated Jun. 11, 2021, pp. 1-16.
UK Search Report for GB 2004175.2, dated Jun. 30, 2020, pp. 1-3.

*Primary Examiner* — Ryan Johnson
(74) *Attorney, Agent, or Firm* — Thomas|Horstemeyer, LLP

(57) ABSTRACT

An oscillation device, such as a frequency standard or "atomic clock", is disclosed. The device comprises: a system capable of undergoing transitions between different energy states, the transitions defining at least a first resonance frequency and a second resonance frequency; an excitation device arranged to induce the system to undergo such transitions; a detection device arranged to detect a response of the system caused by the excitation device, to produce an output; and a controller arranged to receive the output, to control the excitation device to stimulate said transitions, and to obtain signals corresponding to at least the first and second resonance frequencies; wherein the controller is also arranged to process the obtained signals to produce a corrected output signal that is compensated against at least one influence on the resonance frequencies of the system.

18 Claims, 1 Drawing Sheet

(56) References Cited

U.S. PATENT DOCUMENTS

| | | |
|---|---|---|
| 2013/0176081 A1 | 6/2013 | Nishida |
| 2015/0358026 A1 | 12/2015 | Gan |
| 2017/0003658 A1* | 1/2017 | Bertsch .................. G01R 33/60 |
| 2017/0179967 A1* | 6/2017 | Maki ........................ G01S 19/37 |
| 2018/0069557 A1 | 3/2018 | Maki et al. |

* cited by examiner

OSCILLATION DEVICE

CROSS-REFERENCE TO RELATED APPLICATIONS

This application is the National Stage of International Application No. PCT/GB2021/050648, filed Mar. 16, 2021, which claims priority to GR 20200100135, filed Mar. 16, 2020 and GB 2004175.2, filed Mar. 23, 2020, which are entirely incorporated herein by reference.

FIELD OF THE INVENTION

The present invention relates to the field of oscillation devices, for example for use as time-keeping devices or frequency standards, such as in the field of devices known as "atomic clocks".

BACKGROUND OF THE INVENTION

Devices called atomic clocks have been known for several decades and are able to keep time with very high precision. Conventional atomic clocks use atoms in a gas phase that can undergo transitions that correspond in energy to electromagnetic radiation in the microwave part of the spectrum. In one example a tunable microwave cavity contains the gas and the cavity can be tuned such that the field in the cavity oscillates very stably at a frequency corresponding to the energy transition in question. Compact clocks, known as "chip-scale atomic clocks", have recently been developed that use a vapor of atoms such as caesium or rubidium. There have also been developments using oscillations at frequencies corresponding to the optical (visible) part of the electromagnetic spectrum.

The availability of very high stability frequency standards, and the time-keeping that they provide, is used in many fields, including the synchronization of communication networks and in positioning systems, such as the satellite-based global positioning system (GPS). Historically, atomic clocks have generally been quite large, delicate and have significant power requirements while operating. Thus there are the problems of providing compact, reliable, portable, low power atomic clocks.

Some proposals have been made regarding using endohedral fullerenes in a solid state atomic clock; see for example U.S. Pat. No. 7,142,066 or EP 2171546 B1. However, there are still problems regarding reducing environmental influence on the time-keeping; for example the clock transition frequency can vary with temperature of the material, which is undesirable for a stable clock. The reason for the temperature sensitivity is that the encapsulated atom in the center of the fullerene cage vibrates about its equilibrium position. If the temperature increases, then this thermal motion increases, so the electron wavefunction is distorted, this modifies the hyperfine coupling, and therefore alters the clock frequency. It is very difficult or impossible to actively stabilize the temperature with the precision needed to produce a stable clock of the desired precision.

The present invention aims to alleviate, at least partially, some or any of the above problems.

SUMMARY OF THE INVENTION

The present invention provides an oscillation device comprising:
a system capable of undergoing transitions between different energy states, the transitions defining at least a first resonance frequency and a second resonance frequency;
an excitation device arranged to induce the system to undergo such transitions;
a detection device arranged to detect a response of the system caused by the excitation device, to produce an output;
a controller arranged to receive the output, to control the excitation device to stimulate said transitions, and to obtain signals corresponding to at least the first and second resonance frequencies;
wherein the controller is also arranged to process the obtained signals to produce a corrected output signal that is compensated against at least one influence on the resonance frequencies of the system.

Further optional aspects of the invention are defined in the dependent claims.

BRIEF DESCRIPTION OF THE DRAWINGS

Embodiments of the invention will now be described, by way of non-limiting example, with reference to accompanying drawings, in which.

DETAILED DESCRIPTION

Figure 1:
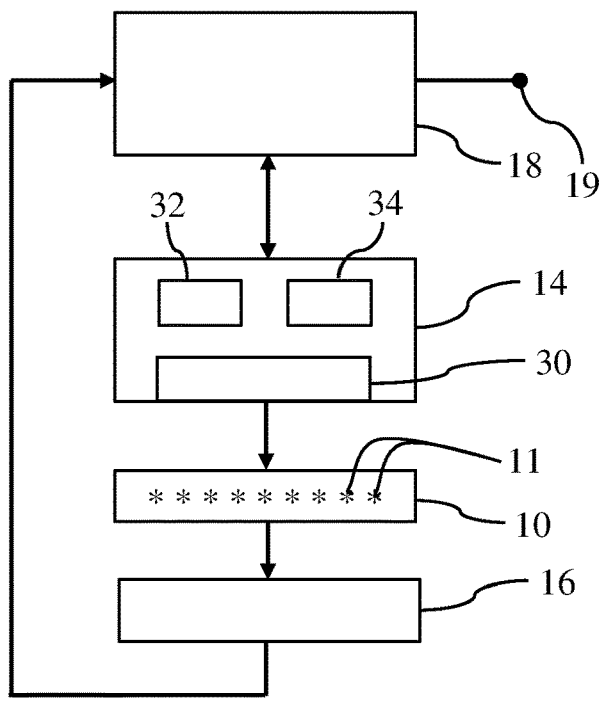
FIG. 1 is a schematic diagram of an oscillation device according to an embodiment of the invention.

FIG. 1 shows components of an oscillation device according to an embodiment of the invention. Such a device may sometimes be referred to as an "atomic clock" (or molecular clock); however, it should, of course, be noted that the term "atomic clock" is simply a convenient shorthand term for such devices. Firstly, they need not necessarily be "clocks". The heart of the device is an arrangement that can provide oscillations at a stable frequency. For this reasons, such devices may also be known as "frequency standards". By counting the oscillations of the standard frequency the clock function can be obtained because each oscillation represents a precise period of time. Secondly, the system undergoing the oscillations does not necessarily have to be "atomic" i.e. a single atom or atoms, but could also be ions, atomic clusters, molecular fragments, small molecules, crystalline defects or other suitable species. If the term "atomic clock" is used herein, this is purely for convenience; it is understood by the person skilled in the art to encompass all of the above terms/systems and further alternatives.

Referring to FIG. 1, the core of the device is the medium 10 that comprises a system 11 which responds at particular frequencies.

An excitation device 14 both excites the system 11 of the medium 10 to cause it to undergo transitions which generate the time-keeping oscillations, and also probes the medium 10 such that the oscillations can be measured and the device controlled.

A detection device 16 is used to sense the response of the system 11 induced by the excitation device 14. The output of the detection device 16 is fed to a controller 18. The controller 18 produces a corrected output signal at output 19, which is the clock signal or frequency standard, and the controller 18 controls the excitation device 14.

Although the components in FIG. 1 are shown as separate items, they may, of course, be integrated; for example some or all of the components can be provided on a single, monolithic chip or integrated circuit, fabricated using techniques known from the fields of microlithography, nanotechnology, micro-electro-mechanical systems (MEMS) and/or nano-electro-mechanical systems (NEMS). Some or all of the components can also be provided with shielding from external influences, for example using a mumetal shield (not shown) to shield from magnetic fields and act as a Faraday cage to shield from electric fields.

Each of the components of FIG. 1 will now be described in more detail.

1. The Medium

In this preferred embodiment, the medium 10 is made of condensed matter, such as a solid, whether crystalline or non-crystalline, or such as a glass or a polymer or other highly viscous material, or such as a liquid solution.

The medium 10 comprises a system 11 capable of undergoing transitions between states which have an energy difference corresponding to a particular oscillation frequency. In the preferred embodiment, the system 11 is a plurality of endohedral fullerenes.

The term "Fullerene" refers to a cage-like structure formed of carbon atoms and also known as carbon buckminster-fullerene or bucky-balls. The cage can be written as $C_n$, and the cage can be of various sizes; preferred embodiments include n=60, 70, 74, 80, 82, 84 and 90, but this is not an exhaustive list. Some fullerenes such as $C_{60}$ and $C_{80}$ are spherical, but most are elongated. The diameter of the fullerene is typically of the order of 1 nm. The term fullerene used herein also encompasses derivates of the basic buckminster-fullerene cages.

The term "Endohedral" means that a species is located within the fullerene cage. According to one embodiment, the endohedral species is a single atom of an element. In some endohedral fullerene systems the endohedral species donates one or more electrons to the cage. Known examples of atomic endohedral species include Er, Gd, P, La, Lu, N, Sc, Tm, Y, Ho or Pr, in a variety of different size fullerene cages. Preferred endohedral species include any Group V element (N, P, As, Sb or Bi). One preferred embodiment is endohedral nitrogen in $C_{60}$ (i.e. a single nitrogen atom inside a carbon bucky-ball, written as $N@C_{60}$). Diatomic endohedral species are also known, such as $Er_2$, $Ce_2$, $Hf_2$ or $La_2$. Other preferred embodiments include trimetallic nitride templated endohedral metallofullerenes (TNT EMFs) of the form $M_3N@C_n$ where M can be one or more metal elements (for example Sc or Er, or a combination), and n is preferably 80, but can take other values.

Endohedral fullerenes are attractive for use in a precision oscillator because the endohedral species is shielded from the environment by the carbon cage. This means that both the electron and nuclear spin lifetime and coherence time of the endohedral species can be very long which is advantageous for stable frequency operation.

The endohedral fullerenes can be embedded in a solid matrix, either in a random manner or in a specific pattern. Furthermore, the endohedral fullerenes may be provided within other structures, such as carbon nanotubes. A solid substrate can be provided to support the endohedral fullerenes and the matrix or other structures. The endohedral fullerenes may be in the form of a crystalline solid or powder, or may be deposited on a surface in a continuous layer or using a supramolecular template, or they may be in solution. The concentration may be diluted to reduce spin-spin dephasing and thereby increase $T_{e2}$ (the electron spin coherence time). For example, a concentration of the order of $10^{16}$ molecules of $N@C_{60}$ per millilitre (number density of molecules per $cm^3$) or lower, provided that it is reasonably uniformly dispersed, typically provides a spin decoherence time that is not limited by dipole-dipole interactions. Higher concentrations can be used, but, at significantly higher concentrations, the decoherence time deteriorates. The invention is not limited to a particular concentration or range of concentrations.

Two preferred examples of endohedral fullerenes for use in this embodiment of the invention are $N@C_{60}$ and $P@C_{60}$. However $N@C_{60}$ is the presently preferred choice because it offers superior spin properties and thermal stability and does not have the significant safety hazards associated with the production of $P@C_{60}$, though $P@C_{60}$ is still one option. For $N@C_{60}$ the electron spin lifetime $T_{e1}$ can be as long as at least 0.1 ms at room temperature and a coherence time $T_{e2}$ of approximately $\frac{2}{3}$ $T_{e1}$ has been obtained empirically (theoretically, $T_{e2}$ can be up to 2 $T_{e1}$). The nuclear spin lifetime $T_{n1}$ and coherence time $T_{n2}$ are also extremely long, for example at low temperature $T_{n1}$ Can be almost arbitrarily long (several hours at 4.5 K).

Both N and P offer isotopes with nuclear spin I=½. This nuclear spin value is preferred because it has only two possible values along any given axis, such as an axis imposed by an applied magnetic field, namely +½ and −½; this eliminates some sources of decoherence such as nuclear quadrupole broadening and carbon hyperfine broadening. Therefore, in a preferred embodiment, either one or both of the endohedral species and/or the carbon of the fullerene are isotopically purified forms.

Figure 2:
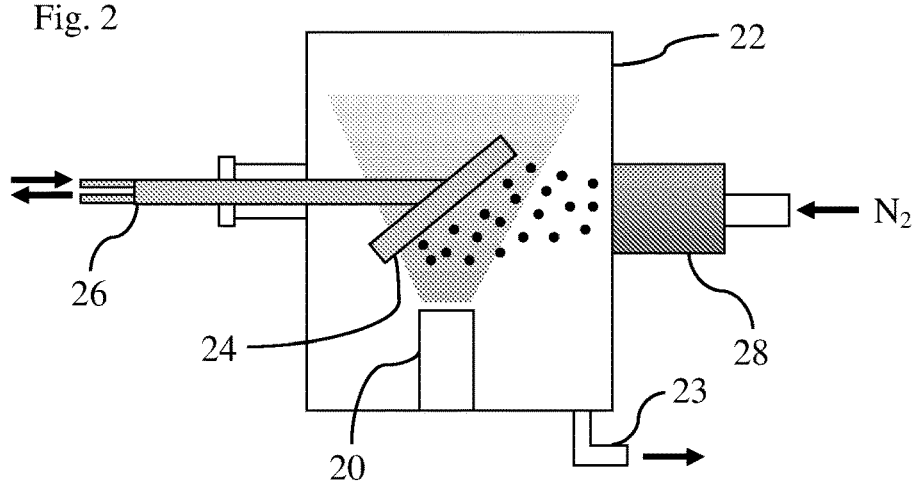
FIG. 2 is a schematic diagram of an apparatus for the production of $N@C_{60}$ for use as a system for undergoing transitions in an oscillation device according to an embodiment of the invention.

An ion implantation method of producing $N@C_{60}$, as an exemplary endohedral fullerene for use in embodiments of the invention, will now be described with reference to FIG. 2. Approximately 0.5 g of $C_{60}$ powder is put into an effusion cell 20 inside a vacuum chamber 22 evacuated at a pressure of $\sim 10^{-6}$ mbar via pump port 23. The effusion cell 20 is heated at 500° C. Under these conditions the $C_{60}$ is sublimed inside the chamber 22 and begins to condense onto a water-cooled copper target 24 placed above the effusion cell 20. Cooling water is fed to and returned from the target 24 via tubing 26. At the same time, the copper target 24 is bombarded with low energy nitrogen ions produced by a commercial ion source 28 supplied with an $N_2$ gas feed. Typical values for the beam energy and beam current are 40 eV and 1-100 mA, respectively. The orientation of the target 24 is such that it is located at 45° angles to both the effusion cell 20 and the nitrogen ion source 28.

After a few hours of operation, the copper target 24 is covered with a fullerene layer, a few tens of micrometers thick. A quartz crystal thickness monitor (not shown) is used to measure the growth of the fullerene film on the target 24 in such a manner that the rate of $C_{60}$ sublimation matches the nitrogen-ion bombardment rate.

The copper target 24 is subsequently immersed into an organic solvent such as $CS_2$ in order to extract the fullerenes. The resulting fullerene solution is ultrasonicated for a few minutes and filtered. Between 0.2 and 0.3 g of $N@C_{60}/C_{60}$ mixture is dissolved in $CS_2$, while any insoluble material is discarded. The insoluble soot comprises polymerised fullerenes and destroyed fullerene cages.

The filtered solution is characterized by EPR (electron paramagnetic resonance spectroscopy). The molar ratio of $N@C_{60}/C_{60}$ is typically found to be approximately $10^{-4}$. The concentration of $N@C_{60}/C_{60}$ is enriched by using a multi-stage chromatographic method. $^{14}N@C_{60}$ or $^{15}N@C_{60}$ can be produced selectively by using $^{14}N_2$ or $^{15}N_2$ gas to be ionised, respectively.

A methodology for the synthesis of $P@C_{60}$ is the same as for $N@C_{60}$, with the difference that phosphine gas ($PH_3$) is used as source gas for the production of phosphorous ions for implantation into the fullerene molecules. $PH_3$ is very flammable and extremely toxic, so specialised infrastructure is required to avoid potential laboratory contamination by such a poisonous material, and the equipment and handling techniques must comply with the relevant regulations.

Alternatively, other binary phosphorus compounds such as nitrides (e.g. $P_3N_5$) that are more stable and less toxic than $PH_3$ can be used. These compounds could be inserted as dopants during an arc discharge process for the synthesis of endohedral fullerenes. Under arc reactor conditions, these compounds decompose into their atomic constituents, so as to insert phosphorus into fullerene molecules.

The invention is not limited to endohedral fullerenes. Another embodiment of the invention uses defects in crystals as the system that undergoes transitions. For example, single crystal diamond containing two kinds of color center, such as nitrogen-vacancy and silicon-vacancy defects, will undergo transitions determined by both species.

In embodiments of the invention, the system undergoing transitions defines at least a first resonance frequency and a second resonance frequency. This can be implemented in several ways:

(i) The system comprises a single species that has a plurality of accessible transitions at different frequencies. The system typically comprises a large number of substantially identical examples of that species, but could in theory be just one molecule/ion/atom etc. One embodiment uses $^{15}N@C_{60}$, which in a particular parallel-field configuration has magnetic dipole transitions at approximately 39 MHz, 50 MHz, and 58 MHz.

(ii) The system comprises a mixture of chemically similar species with different isotopic composition. One transition from each species is monitored in the device. One embodiment uses a mixture of $^{15}N@C_{60}$ and $^{14}N@C_{60}$; the nitrogen isotopes have different nuclear spins and hyperfine coupling strengths, and therefore different spin resonance frequencies.

(iii) The system comprises a mixture of chemically/elementally different species, and a transition from each species is monitored in the device. One embodiment uses a mixture of $^{15}N@C_{60}$ and $^{31}P@C_{60}$.

Although techniques (ii) and (iii) above mention using a 'mixture', which is preferred for simplicity, in alternative embodiments it is equally possible to retain the different species in separate containers or in/on separate portions of the overall medium 10.

3. Excitation Device and Detection Device

The excitation device 14 comprises a source 30 of electric, magnetic or electro-magnetic oscillations at one or more frequencies. In the preferred embodiment, as discussed below, the frequencies correspond to the microwave part of the electro-magnetic spectrum, for example, tens of MHz, so the source 30 is a microwave source. The microwave source 30 in this embodiment is driven by two oscillators 32, 34 to produce microwave excitations at two different frequencies. Each oscillator 32, 34 can be an analogue oscillator or a digital synthesiser. There is a wide choice of known cavity design. Features from the field of electron spin resonance (ESR) measurement may be employed, for example standard ESR spectrometers use cylindrical split ring resonators.

Another alternative is a microwave stripline resonator; this could even incorporate more than one resonant frequency by having striplines angled with respect to each other. In an alternative arrangement, each oscillator 32, 34 is provided with a separate excitation source which it drives. In FIG. 1, the excitation device is illustrated as comprising the oscillators 32, 34; however, the oscillators could alternatively comprise part of the controller 18.

The detection device 16 detects absorption at the excitation frequencies, either by directly measuring the change in field strength, or by detecting a change in the transparency of the medium 10. One example of a detection device is a microwave sensor. Another example is circuitry to detect the impedance of the resonant cavity—change in impedance implying change in absorption. A third example is optical detection. The detection device 16 may be separate from the excitation device 14, as shown in FIG. 1, or they may be integrated with each other. Furthermore, the detection device can comprise dedicated units for detecting each desired transition resonance frequency, or can be a common detector for all frequencies.

In the preferred implementation of the invention, the detection is performed using spin resonance by a spin resonance detection device. There are two approaches to using spin resonance for this purpose: continuous wave spin resonance and pulsed spin resonance. Using continuous wave spin resonance, detection is achieved by observing an absorption of the applied microwaves; this can be detected as a change in impedance of the resonant cavity containing the spin species. Using pulsed spin resonance, detection is achieved by observing the induction from a precessing magnetic moment in the sample; this can be achieved by applying a sequence of $\pi$ and $\pi/2$ pulses, and observing spin echo, as is done in the field of magnetic resonance imaging (MRI).

4. Controller

As explained above, the system 11 has a plurality of different energy states. A transition between two states has a characteristic resonance frequency f related to the energy difference E between those states by Planck's constant h: $E=hf$.

In a preferred embodiment of the invention with $^{15}N$ as the endohedral species in an endohedral fullerene such as $N@C_{60}$, a plurality of different energy states arise from the different possible orientations of the $^{15}N$ electronic magnetic dipole moment with respect to its nuclear magnetic dipole. A transition of the N atom between these states arising from the magnetic dipole-dipole interaction is known as a hyperfine transition. In general atomic systems, these differences in energy level are due to the magnetic dipole-dipole interaction between the nuclear magnetic dipole moment and the electronic magnetic dipole moment, and a transition between states with different energy level is termed a 'magnetic dipole transition' or a 'spin resonance transition'. Of course, this is merely one exemplary system and form of transition.

Figure 3:
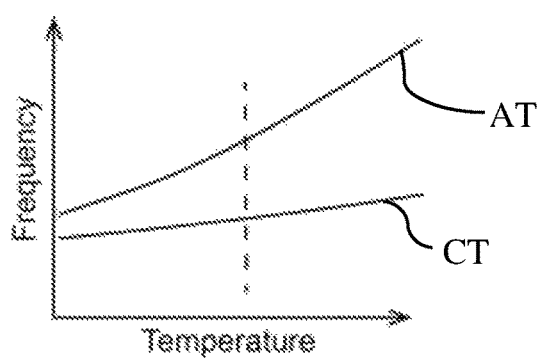
FIG. 3 shows plots of the resonance frequency of two different transitions as a function of temperature in an exemplary system.

Embodiments of the invention provide a system 11 that has at least two different transitions, that can be referred to as a clock transition CT and an auxiliary transition AT. These transitions define at least a first resonance frequency $f_A$ (clock transition), and a second resonance frequency $f_B$ (auxiliary transition). FIG. 3 shows a plot of two typical resonance frequencies (labelled as arising from the clock transition CT and from the Auxiliary transition AT) as a function of temperature. The vertical dashed line indicates the nominal operating temperature. It can be seen that the resonance frequencies change as the temperature deviates from the nominal operating temperature.

Referring back to FIG. 1, the controller 18 controls the oscillators 32, 34 such that their frequencies coincide with two resonance frequencies $f_A$ and $f_B$ of the system, as detected by the detection device 16 (detecting the response of the system 11 to the source 30 being driven by the oscillators 32, 34, with the output of the detection device being fed back to the controller to adjust the oscillators 32, 34 as necessary). As the temperature of the system changes, the oscillators 32, 34 will track the two resonance frequencies $f_A$ and $f_B$, under the control of the controller 18 using the feedback from the detection device 16. Thus the controller 18 obtains signals corresponding to the two resonance frequencies $f_A$ and $f_B$, either based on control signals that it has sent to the excitation device 14, or directly from the oscillators 32, 34. These signals can be analog or digital, and can be literally oscillations at frequencies $f_A$ and $f_B$, or can be some other form of signal representative of those frequencies.

As illustrated schematically in FIG. 3, the ratio of the two frequencies is unique for each temperature (as is the difference between the frequencies, provided the temperature dependency of the two transitions is not the same as each other). The controller 18 processes the signals corresponding to the two frequencies $f_A$ and $f_B$ (for example by taking their ratio) to obtain a value representative of the current temperature of the system 11, or more particularly, representative of the temperature deviation from the nominal operating temperature. The controller then uses this value, together with a previously determined temperature dependence of the clock transition CT (a thermal coefficient of frequency change; such as the gradient or derivative of the clock transition frequency around the nominal operating temperature) in order to obtain a corrected value for the first resonance frequency—i.e. the frequency it would be at the nominal operating temperature—and then provides this corrected frequency as a signal at output 19 as a frequency standard or clock signal that is compensated against changes in temperature affecting the oscillation system 11. The corrected frequency can be synthesized for the output 19, for example by modifying the frequency signal from one of the oscillators 32, 34.

Effectively, monitoring a second resonance frequency of an auxiliary transition, in conjunction with the frequency of the clock transition, and taking their ratio or difference, provides a thermometer for assessing the temperature of the system, which can then be used as a feedback signal to compensate the frequency of the clock transition to correct for changes in temperature. Of course, this can all be done via signal processing, using dedicated or general purpose hardware, analog or digital; it is not necessary to obtain the actual value of the temperature of the system, and the output corrected (or compensated) signal can be different from any of the actual resonance frequencies, such as a multiple or fraction thereof, or a composite of the two resonance frequencies—but it is more stable with respect to variation in temperature than the actual resonance frequency of the system. The predetermined variation of the clock frequency with temperature can be stored for example as coefficient value or values, as an equation, or as a look-up table. The second resonance frequency (from the auxiliary transition) should vary with temperature in a different way from the first resonance frequency (from the clock transition). More than two transitions can be used in order to provide even more precise temperature correction.

The above embodiment of the invention compensates to stabilize the clock frequency against changes in temperature. Other embodiments of the invention can equally compensate against a different environmental influence or perturbation of the resonance frequency, for example changes in magnetic field. This works as described above, but with 'temperature' replaced by 'magnetic field'.

A generalized embodiment of the invention can compensate for multiple different perturbations or environmental influences on the resonance frequency of a clock transition. For example, by measuring the resonance frequency of three transitions, clock frequency corrections can be made for two different factors, such as temperature and magnetic field. In general, to compensate for m different factors, the device must detect at least m+1 transition resonance frequencies, with at least two of the frequencies varying differently from each other for each factor being compensated.

Embodiments of the invention can, of course, additionally employ regulation to control the environment of the oscillation system 11, such as thermal control and stabilization of an applied magnetic field. Indeed, signals obtained from the resonance frequencies for determining the amount of frequency compensation mean the device can act a sensor (or sensors) for environmental influences at the oscillation system, such as temperature and magnetic field. These signals can provide feedback for controlling the environment of the oscillation system 11 (such as temperature control and/or regulation of other factors) to maintain the oscillation system 11 at or close to a desired operating point. This control suppresses higher order variations in frequency with temperature and/or other factors, and thereby avoids deterioration in the frequency compensation. However, the device of the invention can provide more precise correction of the output signal and with essentially zero lag in response to a change, compared with solely regulating the environment at the oscillation system. In one example of a device, the signals (or signal) representative of one or more environmental influences (temperature, magnetic field etc) are provided as output(s) such that the device acts as a novel sensor. This can be done with or without using the signals for feedback control, and can be done in a device which does or does not produce a corrected output signal such as a clock signal or frequency standard.

The invention claimed is:

1. An oscillation device comprising:
   a system capable of undergoing transitions between different energy states, the transitions defining at least a first resonance frequency and a second resonance frequency;
   an excitation device arranged to induce the system to undergo such transitions;
   a detection device arranged to detect a response of the system caused by the excitation device, to produce an output;
   a controller arranged to receive the output, to control the excitation device to stimulate said transitions, and to obtain signals corresponding to at least the first and second resonance frequencies;
   wherein the controller is also arranged to process the obtained signals to produce a corrected output signal that is compensated against at least one influence on the resonance frequencies of the system; and
   wherein the corrected output signal of the controller is a corrected first resonance frequency, wherein the corrected output signal is obtained using the ratio of the first and second resonance frequencies, in conjunction with a predetermined coefficient of change of the first resonance frequency with an environmental influence.

2. The device according to claim 1, wherein the system comprises a single species having a plurality of transitions of different resonance frequencies.

3. The device according to claim 1, wherein the system comprises a plurality of species of different isotopic composition, wherein one species undergoes transitions defining the first resonance frequency and a different species undergoes transitions defining the second resonance frequency, and wherein the detection device is arranged to detect at least one resonance frequency of each species.

4. The device according to claim 1, wherein the system comprises a plurality of different chemical species, wherein one species undergoes transitions defining the first resonance frequency and a different species undergoes transitions defining the second resonance frequency, and wherein the detection device is arranged to detect at least one resonance frequency of each species.

5. The device according to claim 3, wherein the plurality of species are intermixed or are separate from each other.

6. The device according to claim 1, wherein the system is condensed matter.

7. The device according to claim 1, wherein the system comprises at least one endohedral fullerene and/or at least one crystalline defect.

8. The device according to claim 1, wherein the excitation device comprises at least two driving oscillators, whose frequencies are controlled by the controller based on the output of the detection device, to stimulate said transitions, and wherein the frequencies of the oscillators provide the first and second resonance frequencies to the controller.

9. The device according to claim 1, wherein the controller is arranged to produce at least one feedback signal, based on at least the first and second resonance frequencies, which at least one feedback signal is useable to control environmental influence at the system.

10. The device according to claim 9, wherein the environmental influence is at least one of temperature and magnetic field.

11. The device according to claim 9 comprising at least m+1 resonance frequencies, and wherein the corrected output signal is compensated against m environmental influences on the resonance frequencies of the system.

12. The device according to claim 1, wherein the detection device is a spin resonance detection device.

13. The device according to claim 1, wherein a transition between said states is a magnetic dipole transition.

14. The device according to claim 1, wherein said states between which transitions occur differ in energy level due to a magnetic dipole-dipole interaction between a nuclear magnetic dipole moment and electronic magnetic dipole moment.

15. The device according to claim 1 wherein the corrected output signal is a frequency standard or clock signal.

16. The device according to claim 3, wherein the system comprises a plurality of different chemical species, wherein one species undergoes transitions defining the first resonance frequency and a different species undergoes transitions defining the second resonance frequency, and wherein the detection device is arranged to detect at least one resonance frequency of each species.

17. The device according to claim 4, wherein the plurality of species are intermixed or are separate from each other.

18. The device according to claim 6, wherein the condensed matter is in the solid state.

* * * * *